United States Patent
Hao et al.

(10) Patent No.: US 7,436,021 B2
(45) Date of Patent: Oct. 14, 2008

(54) DENSE TRENCH MOSFET WITH DECREASED ETCH SENSITIVITY TO DEPOSITION AND ETCH PROCESSING

(75) Inventors: Jifa Hao, Mountaintop, PA (US); Rodney S. Ridley, Mountaintop, PA (US); Gary M. Dolny, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/618,067

(22) Filed: Jul. 11, 2003

(65) Prior Publication Data

US 2004/0104427 A1    Jun. 3, 2004

Related U.S. Application Data

(62) Division of application No. 10/044,220, filed on Nov. 20, 2001, now Pat. No. 6,635,535.

(51) Int. Cl.
*H01L 29/76*    (2006.01)
*H01L 29/94*    (2006.01)

(52) U.S. Cl. .................. 257/328; 257/329

(58) Field of Classification Search ............ 257/328, 257/329, 330, 335; 438/270
See application file for complete search history.

(56) References Cited

U.S. PATENT DOCUMENTS

| 4,767,722 | A | * | 8/1988 | Blanchard ............ 438/270 |
| 4,881,105 | A | * | 11/1989 | Davari et al. ........ 257/334 |
| 5,034,341 | A | * | 7/1991 | Itoh ................... 438/242 |
| 5,508,534 | A | * | 4/1996 | Nakamura et al. ..... 257/135 |
| 5,877,538 | A | * | 3/1999 | Williams ............ 257/401 |
| 5,973,368 | A | | 10/1999 | Pearce et al. |
| 6,051,468 | A | * | 4/2000 | Hshieh .............. 438/270 |
| 6,252,277 | B1 | | 6/2001 | Chan et al. |
| 6,262,439 | B1 | | 7/2001 | Takeuchi et al. |
| 2001/0048131 | A1 | | 12/2001 | Hurkx et al. |

FOREIGN PATENT DOCUMENTS

EP         1041638 A1 * 10/2000

\* cited by examiner

*Primary Examiner*—Kiesha L Rose
(74) *Attorney, Agent, or Firm*—Robert D. Lott, Esq.; Hiscock & Barclay, LLP

(57) ABSTRACT

A power MOSFET 100 has a source metal 112 that contacts silicided source regions 114 through vias 160 etched in an insulating layer 200. The silicide layer 225 provides for a relatively small but highly conductive contact and thus reduces RDSON. The insulating material may be any suitable material including and not limited to one or a combination of materials such as BPSG, PSG, silicon dioxide and silicon nitride. The insulating layer is relatively thin and does not extend deeply into the gate trench.

7 Claims, 4 Drawing Sheets

DENSE TRENCH MOSFET WITH DECREASED ETCH SENSITIVITY TO DEPOSITION AND ETCH PROCESSING

CROSS-REFERENCE TO RELATED APPLICATIONS

This application is a divisional of U.S. patent application Ser. No. 10/044,220 filed Nov. 20, 2001 now U.S. Pat. No. 6,635,535.

FIELD OF THE INVENTION

This invention relates in general to semiconductor devices and, in particular, to MOSFET devices and processes for forming them.

BACKGROUND

Trench MOSFET structures are particularly useful for low-voltage power MOSFET devices. An existing dense trench structure 10 is shown in FIG. 1. The structure uses self-alignment technology of the trench etch and for recessing the polysilicon 22 within the etching. The dense trench MOSFET 10 includes a drain metal 30 on one surface of an N+ substrate 26. A lightly doped N-type epitaxial region 24 is grown on the substrate 26. The epitaxial layer receives a p-well diffusion 20 followed by N+ implants that form source regions 14. A P+ body region 17 is provided between the source implants that form source regions 14. A source metal 12 contacts the N+ source regions 14 and the P+ body region 17. A trench structure includes a sidewall oxide 16 that lines the trench. Within the trench there is a highly conductive layer of polysilicon 22. The polysilicon layer is covered with a dielectric, typically borophosphorosilicate glass (BPSG) 18. In operation, when a voltage is applied to the polysilicon gate electrode 22, the current flows in a vertical direction between the source regions 14 and the drain 30 along the channel adjacent the sidewalls of the trench. The structure 10 shown in FIG. 1 provides for a relatively dense trench structure in the MOSFET power device. The structure uses self-alignment technology for the trench etch and for the polysilicon recess etch. Thereafter, the device is subject to an etching of the BPSG. That etch ensures that there will be enough material removed to establish a good connection to the gate 22 as well as to the source contact 14.

The structure 10 shown in FIG. 1 in its intended process eliminates the need for photo alignments between the source contact and the gate. Such alignments are generally critical steps in conventional MOSFET designs. Nevertheless, the structure 10 of FIG. 1 has two deficiencies. First, the entire active area of the surface of the device is subject to the BPSG etch back. The etching of the BPSG layer 18 can result in large areas on the surface that are subject to damage, defects and contaminants. Second, the gate-to-source capacitance is high due to the component of the polysilicon layer 22, BPSG layer 18 and the overlying source metal layer 12.

As a result, the process to formulate the structure 10 requires that both the BPSG and polysilicon recess etch must be accurately controlled. Otherwise, the devices will fail. Device failure will normally be due to the gate-to-source leakage if the BPSG 18 is over-etched. It is also possible that metal step coverage of layer 12 over the recessed area can be adversely affected by over-etching the BPSG layer 18. If the polysilicon layer 22 is over-etched, the device may fail because no inversion layer will form in the channel region. In addition, the BPSG etch that is used to open the source contact region is difficult to control due to the different substrate topography in the mesa trench and etch regions. Finally, those additional etches may cause additional damage and defects in the devices that could degrade the performance and the reliability of the devices.

SUMMARY

The deficiencies and drawbacks of the structure 10 in FIG. 1 are overcome by the structure and the methods described herein. In the broader aspects of the invention, both the polysilicon and the BPSG recessed etches can be substantially minimized. Since neither the BPSG layer nor the polysilicon layer is excessively etched, there are less defects and damage to each layer. In addition, a high channel density and lower on-state resistance (RDSON) can be obtained by the methods of the invention. In a low-voltage trench MOSFET (typically less than 60 volts), channel resistance is a dominant component of the total RDSON. In this new structure and process, the source contact area is limited and the spreading resistance between the contact opening and source metal must be minimized. This is accomplished by forming a highly-conductive silicide such as titanium silicide or platinum silicide over the exposed source regions.

DETAILED DESCRIPTION

Figure 2:
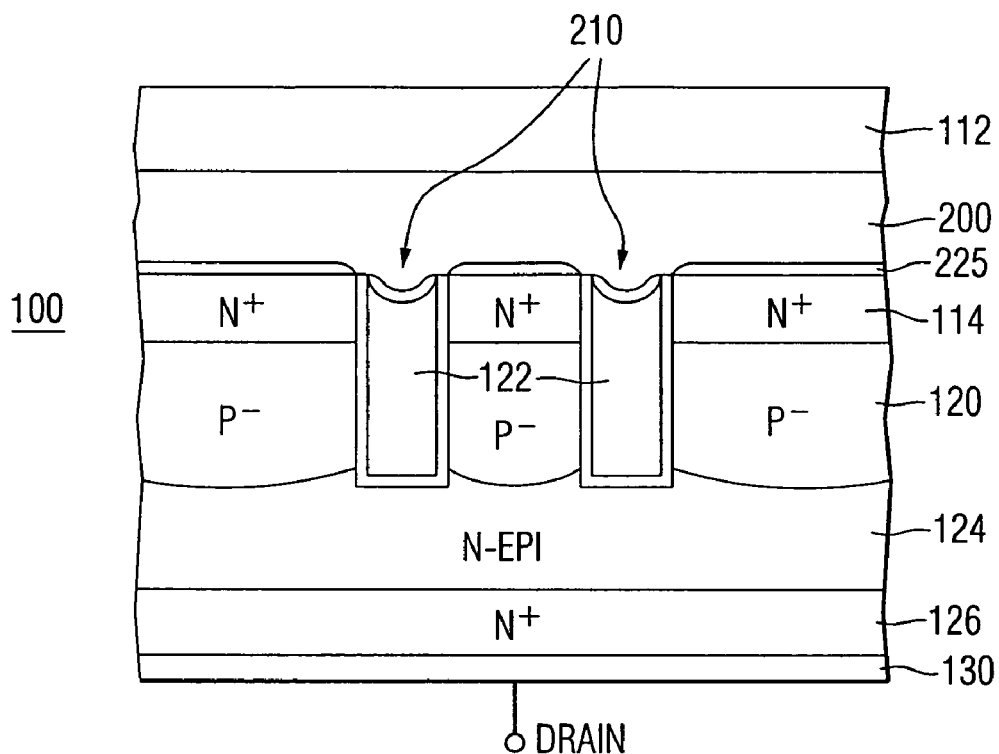
FIG. 2 is a cross sectional view of a device incorporating the invention.

Turning to FIG. 2, there is shown a cross-sectional view of a MOSFET 100 made in accordance with the invention. The front side or source metal 112 contacts silicide layer 225 that covers the respective source regions 114. Metal 112 passes through vias etched in an insulating layer 200. The insulating material 200 may be any suitable material including and not limited to one or a combination of materials such as BPSG, PSG, silicon dioxide and silicon nitride Note that the insulating layer 200 contacts the surface of the source regions 114. It also fills up relatively small recesses in the polysilicon layers 122 that form the gate electrodes. The polysilicon layer 122 fills most of the trench 210 and extends up to and above the layer of the N+ source regions 114. The N+ source regions overlay the p-well 120 that is formed in the N-epitaxial layer 124. The N-epitaxial layer 124 is formed over an N+ substrate 126. The lower surface of the substrate 126 is covered with a backside metal layer 130 to form the drain contact. The insulating layer 200 is suitably patterned and opened to provide vias to the source regions 114. The source metal layer 112 fills the vias and establishes contact to the source regions 114 through the silicide layer 225.

FIGS. 4-8 show selected steps in forming the MOSFET 100. The steps show one skilled in the art how to make a device 100 that provides the structure and features of the invention. One skilled in the art understands that conventional steps for forming the rest of the device 100 are omitted. For example, the P+ body is formed by one such conventional step. It is needed for an operating device, but its disclosure is unnecessary to show how to make and use the invention.

Figure 4:
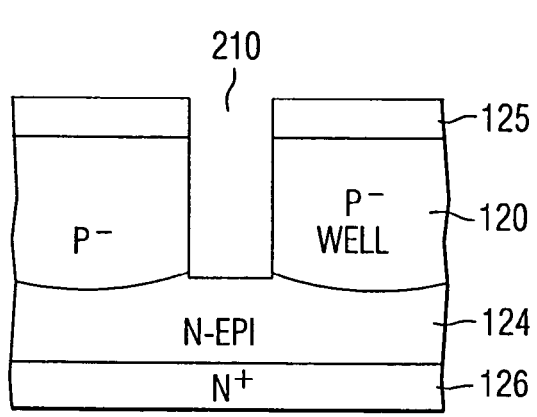
FIGS. 4-8 are progressive views of a cross section of a substrate undergoing the process steps of the invention.

Turning to FIG. 4, a conventional P-type implant (not shown) forms a P-well layer 120 in the upper surface region of the N-type epitaxial layer 124. A screen oxide 125 is formed via a low-temperature oxide process on the upper surface of the N epitaxial layer 124. The oxide layer 125 is suitably patterned to selectively remove portions of the oxide layer form trench regions 210. A reactive ion etch isotropically removes semiconductor material from the epitaxial layer 120 to form the trenches 210.

Figure 5:
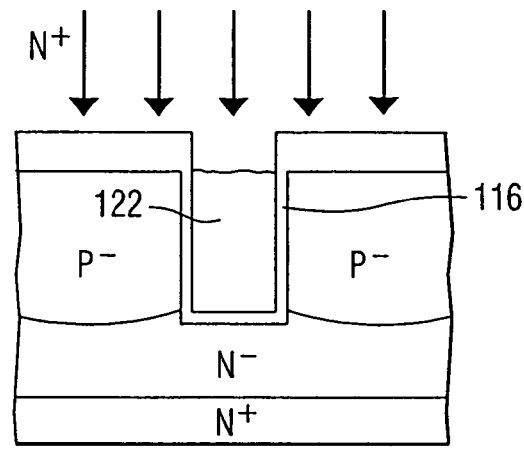

As shown in FIG. 5, a suitable gate oxide 116 is grown over the trench walls and floor. Next, a layer of polysilicon 122 (or any other suitable conductive material) is deposited over the epitaxial layer in order to fill the trench to 10. The polysilicon 122 may be doped or undoped. If it is undoped, a subsequent step implants dopants to render it conductive. The polysilicon layer 122 is etched to remove it from above the source region in the surface of the epitaxial layer 120. Next, an N-type ion implantation step is performed in order to form the N+ source regions 114 in the surface of the epitaxial layer.

Figure 6:
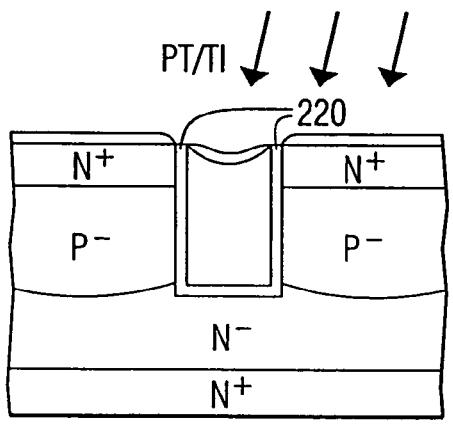

Turning to FIG. 6, the screen oxide layer 125 is removed and a metal layer 220 of platinum or titanium is deposited on the upper surface of the epitaxial layer 124. The metal layer 220 is heated to 6500 C and then to 8500 C. to form a highly conductive silicide layer on the surface of the source regions 114. The metal reacts with the underlying silicon in the epitaxial layer to form a metal silicide 225. That layer is also formed over the surface of the polysilicon 112 in the trench. The metal does not react with the oxide 116 on the trench wall. The unreacted metal 220 is removed by a an etch that leaves the silicide layer 225 but removes the unreacted metal 220. The surface portion of the polysilicon in the trenches is also silicided. Those skilled in the art may use one or more processes and other metals for forming the silicide layer 225. The conductive silicide layer reduces the RDSON resistance of the source region. Because silicide it is highly conductive, only a relatively small area of the silicided source region is needed to provide a reliable electrical contact. As such, one may cover the entire surface of the epitaxial layer with an insulating material and open vias in the insulating material to contact the silicide layer 225.

Figure 7:
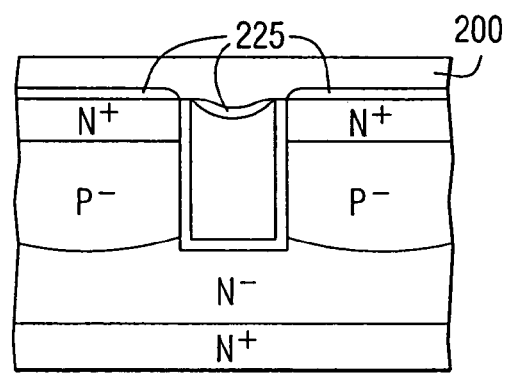
Figure 8:
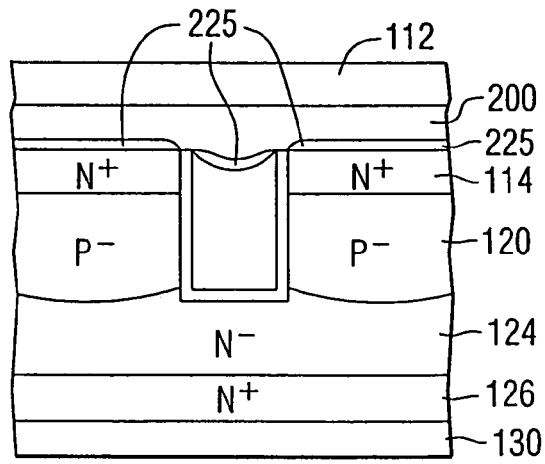

As shown in FIG. 7, an insulating layer of BPSG 200 or any other suitable insulating layer is deposited over the epitaxial layer 120 and on the silicide layer 225. The insulating layer 200 also fills the upper portion of the trench including filling any region that may have been over-etched in the prior step of removing the polysilicon layer. The insulating layer 200 is then patterned to provide suitable vias or openings for source metal contact layer 112. See FIGS. 8 and 9. The silicide layer 225 acts as an etch stop for the via openings 160. The source metal contact layer 112 is deposited by any suitable metal deposition technique, typically sputtering. Since the silicide 225 is highly conductive, a relatively small contact area is needed. The invention thus does not require the extensive etching of the insulating layer 200 because the metal layer 112 does not have to contact the entire surface of the source region. Metal is also deposited on the N+ drain to form a suitable drain contact layer 130.

Figure 9:
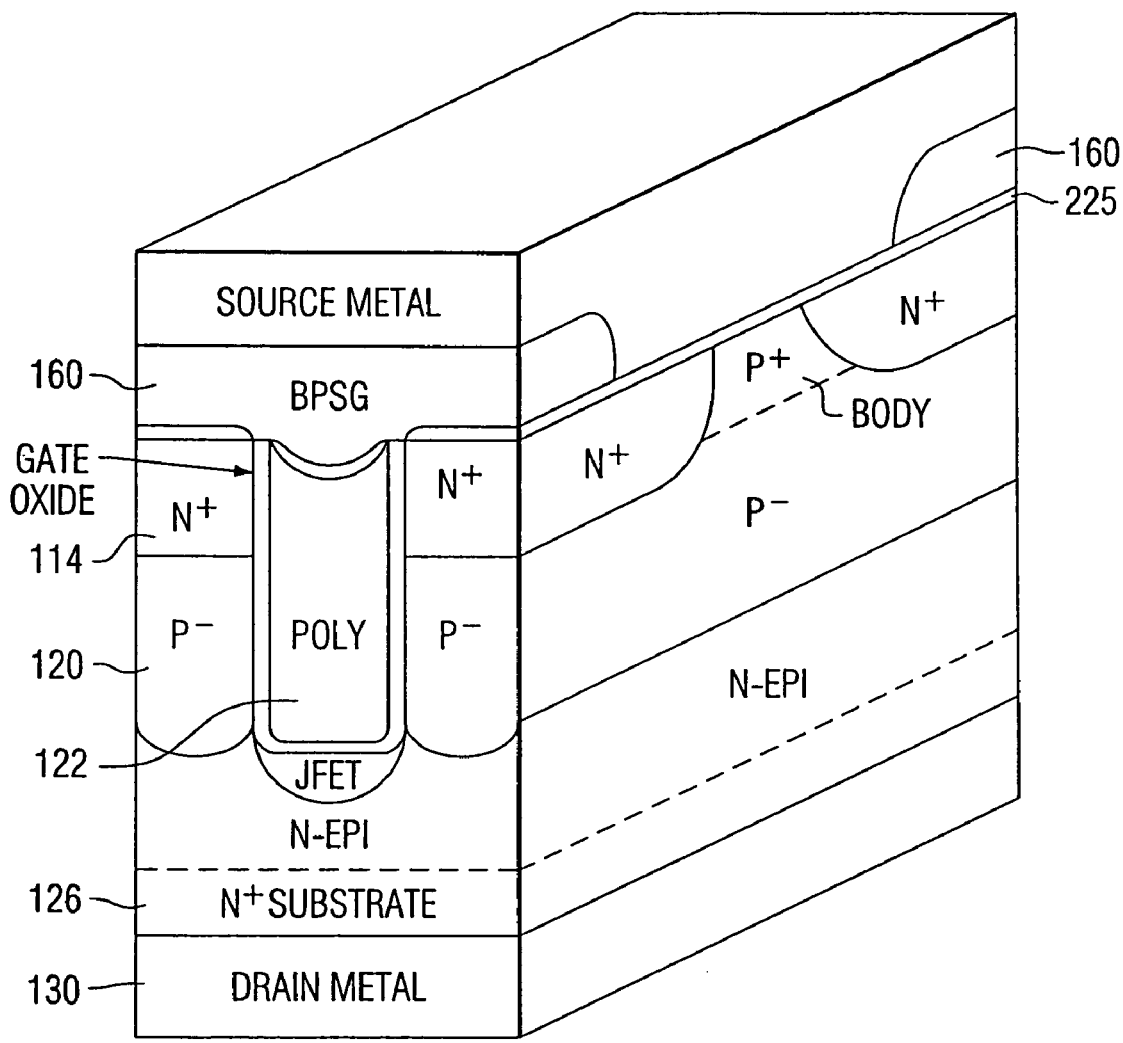
FIG. 9 is a perspective partial sectional view of a device with the invention.

Those skilled in the art will understand that the figures are not to scale but are arranged to show the locations of the components of the device with respect to each other. The opening in the BPSG layer 160 is from 50 to 100 microns wide. When the BPSG layer is opened, it exposes a surface of adjacent stripes of N+ source and P+ body regions. The P+ body regions are likely about one half to one micron wide at the surface of the device and are on a pitch of about 10 microns, the width of the N+ source regions. FIG. 9 shows only a portion of a source metal contact to the surface. As such, four or more N+ source stripes may be exposed in the opening in the BPSG layer.

In accordance with the invention the spreading resistance is held to around 0.0106 mΩ-cm2 for a 100 Φm by 2000 Φm contact opening. Total metal spreading resistance for one chip with the contact opening is 0.0742 mΩ-cm2. This can be optimized by further experiments for reducing spreading resistance. In addition, the new method reduces the total number of mask levels by at least one. New trenches can be formed with eight masking levels, instead of the nine levels required for the structure shown in FIG. 1.

Figure 1:
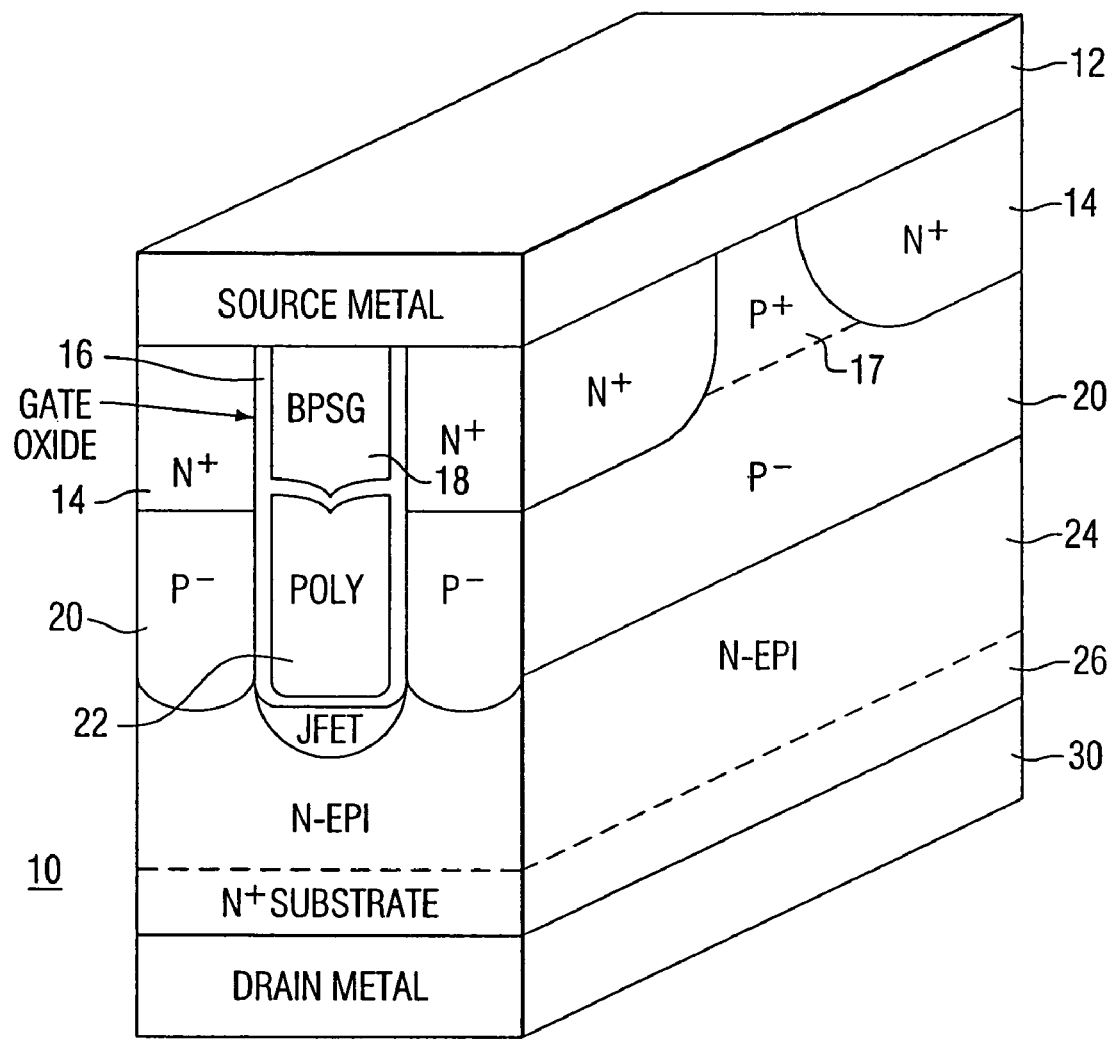
FIG. 1 is three dimensional view of a prior art device.

Those skilled in the art will appreciate that using the above-described process minimizes etching of the insulating layer 200 and the polysilicon layer 122. The method also provides for implanting the source prior to the deposition of the insulating layer 200. The metal contact to the source regions 114 is different from prior art structure 10. As shown in FIG. 1, the metal contact is directly on all or most of the area of the source regions. However, with the invention, the metal contact 112 is made through vias or other openings etched in the insulating layer 200. As a result of the process, the device 100 has less sensitivity due to defects because only relatively small portions of the silicided source in the vias are exposed to the etch step. In addition, any gate-to-source leakage is greatly reduced. Another feature of the invention is that the gate-to-source capacitance is greatly reduced. The invention reduces the depth of the insulating layer 200 in the trench and thereby reduces the gate-to-source capacitance. Another feature is that the process of the invention minimizes the source area over etch problem. Indeed, since the source is protected by the silicide layer 225, there is little or no etching of the source. Finally, the architecture of the method provides for a relatively high-channel density device.

Figure 3:
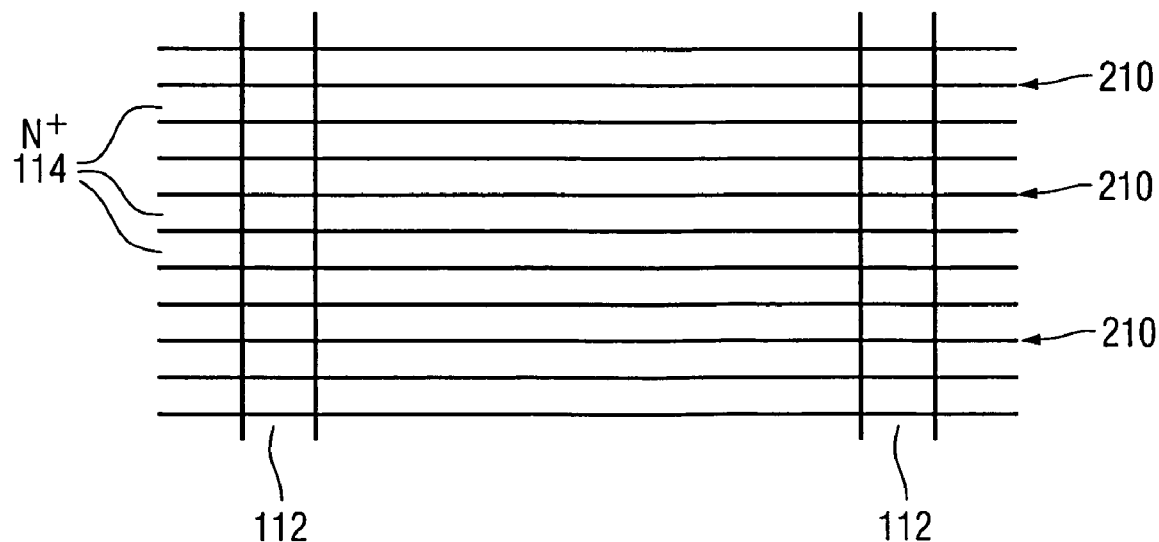
FIG. 3 is a plan view of the device shown in FIG. 2.

The final step in the process provides for contacting the metal 112 to the source regions. This contact may be made by a series of metal stripes that penetrate through openings in the insulating layer. FIG. 3 shows a plan view of the new trench MOSFET with metal contact stripes that are disposed transverse to the trenches.

Those skilled in the art understand that the preferred embodiment of the invention shows a power MOSFET with a cellular source and cellular gate structure and a common drain. That same structure may be converted into a power thyristor. To do so the drain is left as a moderately conductive layer. A cathode layer is formed on the opposite surface. The cathode layer is highly doped and is of opposite polarity to the drain and source. Thus, the power thyristor has four layers, either N+PNP+ or P+NPN+.

Having thus disclosed the preferred embodiment of the invention, those skilled in the art will appreciate that other changes, modifications, additions and omissions of one or more elements or steps may be made without departing from the spirit and scope of the invention as set forth in the following claims.

The invention claimed is:

1. A power semiconductor device with trench gates comprising:
   a) a semiconductor substrate;
   b) a source layer on one surface of said substrate and comprising a high concentration of a dopant of a first polarity;
   c) a single drain region on the other surface of said substrate;
   d) a well layer beneath said source layer doped with a dopant of a second polarity opposite to said first polarity;

e) a region lightly doped with said one polarity positioned above said drain region and below said well layer;

f) plurality of trenches penetrating said source layer and terminating in said region lightly doped with said one polarity, said trenches substantially filled with conductive material;

g) a highly conductive layer on the surface of said source layer comprising a material reacted from a metal and said substrate which forms a highly conductive path extending from a first of said plurality of trenches to a of said plurality of trenches;

h) an insulating layer on said highly conductive layer and on said conductive material in said trenches;

i) vias formed in said insulating layer and extending to said highly conductive layer; and j) conductive material filling said vias for contacting said highly conductive layer.

2. The power semiconductor device of claim 1 wherein said trenches are filled with polysilicon and the top surface of said polysilicon is covered with a highly conductive material reacted from a metal and said polysilicon.

3. The power semiconductor device of claim 1 wherein said highly conductive layer is a silicide.

4. The power semiconductor device of claim 3 wherein said silicide is reacted from platinum or titanium.

5. The power semiconductor device of claim 1 wherein said insulating material on said highly conductive layer is BPSG, PSG, silicon dioxide or silicon nitride.

6. The power semiconductor device of claim 1 wherein said trenches are lined with a trench wall insulating material and said insulating material on said highly conductive layer contacts the ends of said trench wall insulating layers lining said walls of said trenches.

7. The power semiconductor device of claim 1 wherein one or more vias terminated on said surface of said highly conductive layer make electrical contact between said highly conductive source layer and conductive material filling said vias.

* * * * *